(12) United States Patent
Ueda et al.

(10) Patent No.: US 6,475,607 B2
(45) Date of Patent: Nov. 5, 2002

(54) DIELECTRIC CERAMIC COMPOSITION AND MULTILAYERED CERAMIC SUBSTRATE

(75) Inventors: Tatsuya Ueda, Takefu; Kimihide Sugou, Kyoto-fu, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/947,301

(22) Filed: Sep. 5, 2001

(65) Prior Publication Data

US 2002/0025439 A1 Feb. 28, 2002

Related U.S. Application Data

(62) Division of application No. 09/491,261, filed on Jan. 26, 2000, now abandoned.

(30) Foreign Application Priority Data

Jan. 26, 1999 (JP) .............................................. 11-17431
Oct. 15, 1999 (JP) ............................................ 11-294099

(51) Int. Cl.$^7$ ........................... B32B 7/00; B32B 17/00; C03C 14/00
(52) U.S. Cl. ....................... 428/210; 428/209; 428/426; 428/432; 428/446; 428/688; 428/689; 428/699; 428/701; 501/11; 501/139; 501/32
(58) Field of Search ........................... 501/139, 11, 32; 428/426, 432, 446, 688, 689, 699, 701, 209, 210

(56) References Cited

U.S. PATENT DOCUMENTS

| 4,540,676 | A | * | 9/1985 | Chu et al. ................. 361/321.5 |
| 5,729,893 | A | * | 3/1998 | Tanifuji et al. ............. 174/258 |
| 6,108,192 | A | * | 8/2000 | Sugimoto et al. ......... 361/321.1 |
| 6,184,165 | B1 | * | 2/2001 | Kawata ...................... 501/138 |
| 6,403,200 | B2 | * | 6/2002 | Chikagawa et al. ........ 428/209 |

FOREIGN PATENT DOCUMENTS

JP        07069719  A2  *  3/1995

* cited by examiner

Primary Examiner—Elizabeth D. Wood
(74) Attorney, Agent, or Firm—Dickstein, Shapiro, Morin & Oshinsky, L.L.P.

(57) ABSTRACT

A multilayered ceramic substrate is produced by laminating and sintering insulating ceramic layers and one or more dielectric ceramic layers. The insulating ceramic layer is composed of a $BaO-Al_2O_3-SiO_2$ low temperature sintering ceramic material. The dielectric ceramic layer is composed of a dielectric ceramic material containing a dielectric ceramic component represented by $BaO-TiO_2-(Nd_{1-m}Me_m)O_{3/2}$ wherein Me is a lanthanoid and $0 \leq m \leq 1.0$, and a glass component of about 20.0 to 65.0 mole percent of barium oxide, about 5.0 to 50.0 mole percent of silicon oxide and about 10.0 to 50.0 mole percent of boron oxide.

20 Claims, 3 Drawing Sheets

MOLAR RATIO OF CONSTITUENTS
OF GLASS COMPONENT IN
DIELECTRIC CERAMIC COMPOSITION

MOLAR RATIO OF DIELECTRIC CERAMIC COMPONENTS

DIELECTRIC CERAMIC COMPOSITION AND MULTILAYERED CERAMIC SUBSTRATE

This is a divisional of U.S. patent application Ser. No. 09/491,261, filed Jan. 26, 2000 now abandoned which is in the name of Tatsuya UEDA and Kimihide SOGOU.

BACKGROUND OF THE INVENTION

1. Field of the Invention

The present invention relates to a dielectric ceramic composition having a high dielectric constant and to a multilayered ceramic substrate produced by laminating and sintering an insulating ceramic material and a dielectric ceramic material.

2. Description of the Related Art

Performance of electronic parts in electronic fields is being significantly improved. In particular, recent trends in information apparatuses such as mainframe computers, mobile communication terminals and personal computers are improvements in processing speed and the development of miniaturized and multifunctional apparatuses. Such improvements in performance have been primarily achieved by increases in integration density, processing speed and function of semiconductor devices, as exemplified in VLSIs and ULSIs. Regardless of such improvements in semiconductor devices, the operation as a system is hindered by signal delay in substrates for connecting different devices, mismatch of cross-talk and impedance, and noise due to fluctuation of power voltage.

High-performance electronic parts for processing information at high speed are multi-chip modules (MCMs) in which high-performance semiconductor devices are mounted on a ceramic substrate. In multi-chip modules, multilayered ceramic substrates provided with three-dimensionally arranged line conductors are useful to enhance the mounted density of semiconductor devices such as LSIs and to secure sufficient conduction between LSIs. Alumina has been used as a conventional material for multilayered ceramic substrates.

Alumina, however, requires a high sintering temperature of at least 1,300° C. When the multilayered ceramic substrate is produced by a co-sintering process, a high melting point metal, such as tungsten or molybdenum, must be used in line conductors for inner layers. Since these high melting point metals have a large specific resistance, they preclude high density wiring. In addition, aluminum has a large relative dielectric constant of approximately 10. When surface-mounted components such as semiconductor devices are operated at high speeds, significant signal delay will occur. Moreover, alumina has a larger thermal expansion coefficient than that of silicon used in semiconductors. Thus, heat cycles during use result in decreased reliability.

In order to solve these problems, low temperature sintering ceramic materials as composite materials composed of ceramic components and glass components have been intensively researched and have been employed in practice as multilayered ceramic substrates for multilayered modules and multilayered devices. A low temperature sintering ceramic material contains a ceramic composition as a matrix and a glass component. Since this material can be sintered at a low temperature, the versatility of possible design on properties and sintering temperature of the material is significantly high. Since the low temperature sintering ceramic material can be sintered with a low melting temperature metal having low specific resistance, such as silver or copper, the resulting multilayered ceramic substrate has superior high frequency characteristics.

In a recent trial for achieving further miniaturization of an overall module, passive devices such as capacitors and inductors, which are constituents of surface mounted devices (SMDs), are incorporated into a multilayered ceramic substrate. In such a case, the characteristics of the incorporated passive devices must be equivalent or superior to those of devices mounted on the substrate in order to achieve high overall performance of the module. Thus, materials for achieving high electrical characteristics of the surface mounted devices are generally selected as constituents of the multilayered ceramic substrate. For example, a dielectric ceramic layer having high dielectric constant is provided at portions for forming capacitors and an insulating ceramic substrate having a low dielectric constant, e.g., a low temperature sintering ceramic substrate, is provided at other portions in one embodiment.

A material having a specific dielectric constant Er of not greater than 10 is generally used in the insulating ceramic substrate having a low dielectric constant in order to suppress stray capacitance generating between mounted devices such as capacitors and inductors and coupling capacitance between lead lines, which stray capacitance and coupling capacitance causes deterioration of electrical characteristics. Furthermore, such a low dielectric constant is advantageous when the insulating ceramic substrate is used in high frequency regions.

Japanese Patent Publication No. Sho 56-82501, to the present assignee, discloses a dielectric ceramic material for microwave regions having a high dielectric constant and comprising a composition represented by the general formula:

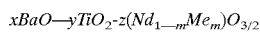

$$xBaO\text{—}yTiO_2\text{-}z(Nd_{1-m}Me_m)O_{3/2}$$

wherein Me is a lanthanoid, $0 \leq m \leq 1.0$, and x, y and z have a molar ratio within a region surrounded by the coordinates A (x=0.20, y=0.70 and z=0.10), B (x=0.20, y=0.40 and z=0.40), C (x=0.02, y=0.70 and z=0.28) and D (x=0.02, y=0.40 and z=0.58) in a ternary diagram. This dielectric ceramic material has a high Q value and a significantly high dielectric constant of 2,000 or more. Moreover, the dependence of the electrostatic capacitance on temperature can be adequately adjusted by varying the content of the lanthanoid.

However, this dielectric ceramic material requires a high sintering temperature in a range of 1,300 to 1,400° C. When a multilayered ceramic substrate is formed using the dielectric ceramic material, it is difficult to simultaneously sinter this dielectric ceramic material and a low melting point metal having low specific resistance, such as copper and silver. Moreover, this dielectric ceramic material has poor adhesiveness to insulating ceramic substrates and particularly low temperature sintering ceramic substrates. Thus, the resulting multilayered ceramic substrate will have low mechanical strength.

When a glass component is added in order to decrease the sintering temperature of the dielectric ceramic material, the mechanical strength of the substrate will be decreased compared to aluminum substrates or electric characteristics will be decreased depending on the type and the content of the glass component. When the mechanical strength of the substrate is maintained, the specific dielectric constant of the substrate is inevitably decreased. Thus, it is difficult to form capacitors having large capacity in the substrate. If such capacitors having large capacity are formed in the substrate, electrodes for the capacitors occupy a large area, which hinders miniaturization and high density integration of the substrate. On the other hand, a substrate having satisfactory electrical characteristics has low mechanical strength which is unsuitable for use in semiconductor devices.

SUMMARY OF THE INVENTION

Accordingly, it is an object of the present invention to provide a dielectric ceramic composition which can be sintered at a low temperature, has superior electrical characteristics and has high mechanical strength after sintering.

It is another object of the present invention to provide a multilayered ceramic substrate which can be sintered at a low temperature, has superior high-frequency characteristics and has high mechanical strength.

According to a first aspect of the present invention, a dielectric ceramic composition is produced by mixing and sintering a dielectric ceramic component represented by $BaO-TiO_2-(Nd_{1-m}Me_m)O_{3/2}$ and a glass component comprising barium oxide, silicon oxide and boron oxide, wherein Me is a lanthanoid and $0 \leq m \leq 1.0$.

Preferably, the glass component comprises a mixture of about 20.0 to 65.0 mole percent of barium oxide, about 5.0 to 50.0 mole percent of silicon oxide and about 10.0 to 50.0 mole percent of boron oxide.

Preferably, the content of the glass component is about 3.0 to 35.0 percent by weight of the dielectric ceramic component.

In a preferred embodiment, when the dielectric ceramic component is that of the aforementioned Japanese Patent Publication No. Sho 56-82501 and is represented by $xBaO-yTiO_2-z(Nd_{1-m}Me_m)O_{3/2}$, $x+y+z=1$, x, y and z have a molar ratio within a region surrounded by the coordinates A (x=0.20, y=0.70 and z=0.10), B (x=0.20, y=0.40 and z=0.40), C (x=0.02, y=0.70 and z=0.28) and D (x=0.02, y=0.40 and z=0.58) in a ternary diagram.

The dielectric ceramic composition in accordance with the present invention further comprises lead oxide in an amount of about 17 percent by weight or less of the dielectric ceramic component.

The dielectric ceramic composition in accordance with the present invention has a high dielectric constant, a high Q value and superior temperature characteristics. In addition, the dielectric ceramic composition can be sintered at a low sintering temperature and has high mechanical strength.

According to a second aspect of the present invention, a multilayered ceramic substrate comprises an insulating ceramic layer having a low dielectric constant and a dielectric ceramic layer having a high dielectric constant, wherein the insulating ceramic layer is a low temperature sintering ceramic layer capable of being sintered at a low temperature, and the dielectric ceramic layer is produced by mixing and sintering a dielectric ceramic component represented by $BaO-TiO_2-(Nd_{1-m}Me_m)O_{3/2}$ and a glass component comprising barium oxide, silicon oxide and boron oxide, wherein Me is a lanthanoid and $0 \leq m \leq 1.0$.

Preferably, the glass component comprises a mixture of about 20.0 to 65.0 mole percent of barium oxide, about 5.0 to 50.0 mole percent of silicon oxide and about 10.0 to 50.0 mole percent of boron oxide.

Preferably, the content of the glass component is about 3.0 to 35.0 percent by weight of the dielectric ceramic component.

In a preferable embodiment of the multilayered ceramic substrate in accordance with the present invention, when the dielectric ceramic component is represented by $xBaO-yTiO_2-z(Nd_{1-m}Me_m)O_{3/2}$, $x+y+z=1$, x, y and z have a molar ratio within a region surrounded by the coordinates A (x=0.20, y=0.70 and z=0.10), B (x=0.20, y=0.40 and z=0.40), C (x=0.02, y=0.70 and z=0.28) and D (x=0.02, y=0.40 and z=0.58) in a ternary diagram.

Preferably, the multilayered ceramic substrate in accordance with the present invention further comprises lead oxide in an amount of about 17 percent by weight or less of the dielectric ceramic component.

In a preferable embodiment, the low temperature sintering ceramic layer may be produced by sintering a glass ceramic composite material comprising barium oxide, aluminum oxide and silicon oxide.

Preferably, the multilayered ceramic substrate may be produced by laminating and sintering a green sheet for the insulating ceramic layer and a green sheet for the dielectric ceramic layer.

Alternatively, the multilayered ceramic substrate is produced by laminating and sintering a green sheet for the insulating ceramic layer and a thick printed film for the dielectric ceramic layer.

Preferably, the multilayered ceramic substrate in accordance with the present invention further comprises a copper-based conductive pattern.

In the multilayered ceramic substrate in accordance with the present invention, the bonding strength between the insulating ceramic layer and the dielectric ceramic layer is high. Moreover, the dielectric ceramic layer has a high dielectric constant, a high Q value and superior temperature characteristics. Thus, the multilayered ceramic substrate can be sintered at a low temperature and has superior high-frequency characteristics and high mechanical strength.

DESCRIPTION OF THE PREFERRED EMBODIMENTS

Figure 1:
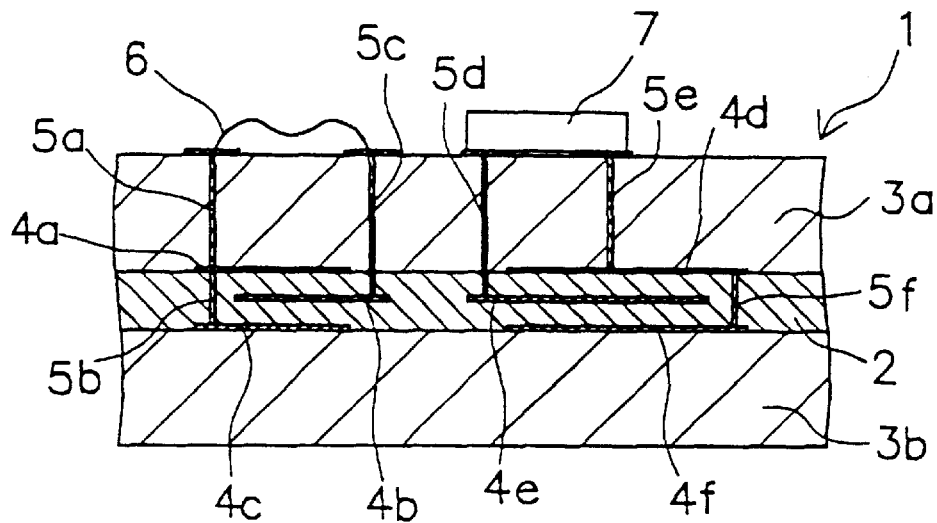
FIG. 1 is a schematic cross-sectional view of a multilayered ceramic substrate in accordance with a first embodiment of the present invention.

With reference to FIG. 1, a first embodiment of the present invention will be described.

On a main surface of a multilayered ceramic substrate 1 in the first embodiment, a thick film resistance 6 is formed by printing and a surface mounted device 7, e.g., a semiconductor IC or a chip capacitor, is mounted. The multilayered ceramic substrate 1 includes insulating ceramic layers 3a and 3b composed of a glass ceramic composite material such as $BaO-Al_2O_3-SiO_2$ and a dielectric ceramic layer 2, which is produced by sintering the dielectric ceramic composition in accordance with the present invention, provided between the insulating ceramic layers 3a and 3b.

The dielectric ceramic layer 2 has a capacitor unit composed of electrodes 4a, 4b and 4c. A via-hole 5b connects the electrodes 4a and 4c. A capacitor component having a given capacitance is formed between the electrodes 4a and 4b and another capacitor component having a given capacitance is formed between the electrodes 4b and 4c. Thus, the capacitor unit has a capacitance which is equal to the total capacitance of the two capacitor components. Via holes 5a and 5c connect this capacitor unit to the thick film resistance 6.

The dielectric ceramic layer 2 also has a capacitor unit composed of electrodes 4d, 4e and 4f. A via-hole 5f connects the electrodes 4d and 4f. Two capacitor components having given capacitance of the capacitor unit are formed between the electrodes 4d and 4e, and between the electrodes 4e and 4f, respectively. Via holes 5d and 5e connect this capacitor unit to the surface mounted device 7.

Since capacitors are formed in the multilayered ceramic substrate 1, this configuration can reduce the number of surface mounted devices. Thus, the surface of the substrate can be effectively used. Moreover, the dielectric ceramic layer 2 having a high dielectric constant is disposed between two electrodes forming a capacitor component. Thus, this configuration enables the formation of capacitors having high capacitance using a relatively small electrode pattern.

The dielectric ceramic layer 2 of the multilayered ceramic substrate 1 contains a glass component having substantially the same composition as that of the inorganic oxide component in the insulating ceramic layers 3a and 3b, that is, barium oxide and silicon oxide in this embodiment. As a result, the bonding strength between the insulating ceramic layers 3a and 3b and the dielectric ceramic layer 2 is high. In addition, mutual diffusion of the constituents between these layers is suppressed; hence, properties of the substrate do not vary substantially. Since the dielectric ceramic layer 2 is composed of the dielectric ceramic composition in accordance with the present invention, the dielectric ceramic layer 2 has a high dielectric constant and a high Q value, and the temperature coefficient of the electrostatic capacitance is adjustable without restriction. Accordingly, the multilayered ceramic substrate 1 has both high reliability and superior electrical characteristics.

Figure 2:
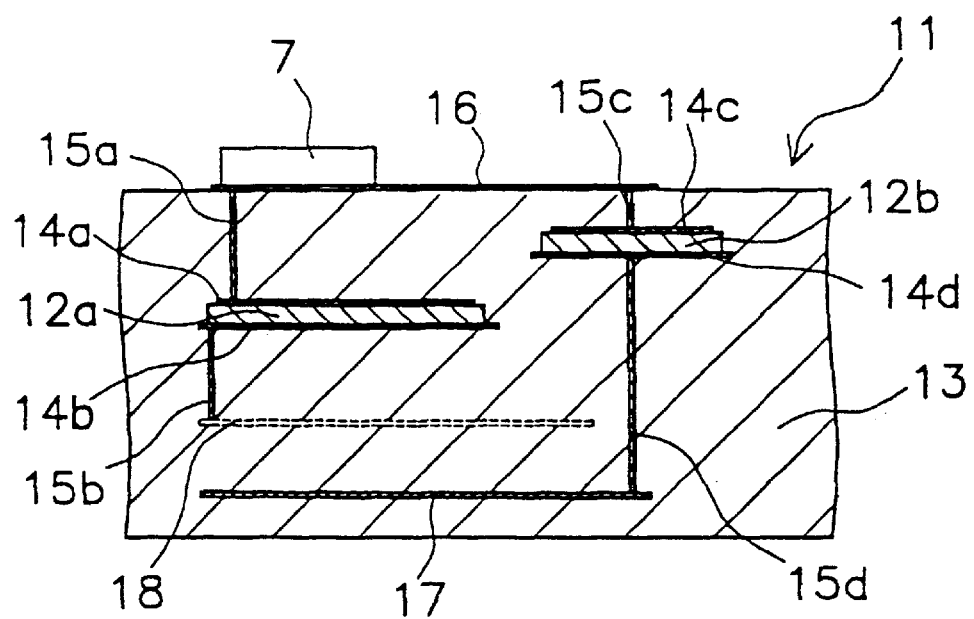
FIG. 2 is a schematic cross-sectional view of a multilayered ceramic substrate in accordance with a second embodiment of the present invention.

A second embodiment will be described with reference to FIG. 2.

On a main surface of a multilayered ceramic substrate 11 in the second embodiment, a surface mounted device 7, e.g., a chip resistance or a semiconductor IC, is mounted. The multilayered ceramic substrate 11 includes an insulating ceramic layer 13 composed of a glass ceramic composite material such as $BaO-Al_2O_3-SiO_2$. Dielectric ceramic layers 12a and 12b composed of the dielectric ceramic composition in accordance with the present invention are provided as thick-film prints between electrodes 14a and 14b and between electrodes 14c and 14d, respectively, in the insulating ceramic layer 13.

The electrodes 14a and 14b and the dielectric ceramic layer 12a therebetween form a capacitor (first capacitor) and the electrodes 14c and 14d and the dielectric ceramic layer 12b therebetween form another capacitor (second capacitor). The first capacitor is connected to the surface mounted device 7 via a via-hole 15a and to a strip line 18 via a via-hole 15b. The second capacitor is connected to the surface mounted device 7 via a via-hole 15c and a line conductor 16 and to a ground conductor 17 via a via-hole 15d.

Since capacitors are formed in the multilayered ceramic substrate 11, this configuration can reduce the number of surface mounted devices. Thus, the surface of the substrate can be effectively used. Moreover, each of the dielectric ceramic layers 12a and 12b having a high dielectric constant is disposed between two electrodes forming a capacitor component. Thus, this configuration enables the formation of capacitors having high capacitance using a relatively small electrode pattern.

The dielectric ceramic layers 12a and 12b of the multilayered ceramic substrate 11 contain a glass component having substantially the same composition as that of the inorganic oxide component in the insulating ceramic layer 13, that is, barium oxide and silicon oxide in this embodiment. As a result, the bonding strength between the insulating ceramic layer 13 and the dielectric ceramic layers 12a and 12b is high. In addition, mutual diffusion of the constituents between these layers is suppressed; hence, properties of the substrate do not vary substantially. Since the dielectric ceramic layers 12a and 12b are composed of the dielectric ceramic composition in accordance with the present invention, these layers have a high dielectric constant and a high Q value, and the temperature coefficient of the electrostatic capacitance is adjustable without restriction. Accordingly, the multilayered ceramic substrate 11 has compatibility between high reliability and superior electrical characteristics.

An exemplary method for making the multilayered ceramic substrate in the first embodiment will now be described.

To 100 parts by weight of powdered alumina as a raw ceramic material is added 20 to 30 parts by weight of a powdered glass mixture primarily composed of barium oxide and silicon oxide, and these are mixed as a raw material for the insulating ceramic layer. The mixture may be calcined at approximately 800 to 1,100° C. if necessary.

Another preferable mixture for the insulating ceramic layer may contain a powdered ceramic, such as $MgSi_4$, $CaZrO_3$ or $BaAl_2Si_2O_3$, and a powdered glass which is primarily composed of BaO and $SiO_2$, or is composed of BaO, $Al_2O_3$ and $SiO_2$. For example, the powdered mixture containing $B_2O_3$, BaO, $Al_2O_3$ and $SiO_2$ is preferably calcined at 800° C. to 1,000° C.

A binder, dispersant, plasticizer and organic solvent are added to the powdered mixture, and these are mixed to form an organic slurry. The organic slurry is shaped by a doctor blade process to form green sheets of a $BaO-Al_2O_3-SiO_2$ composite material for the insulating ceramic layer.

Next, a dielectric ceramic material represented by $xBaO-yTiO_2-z(Nd_{1-m}Me_m)O_{3/2}$ is prepared for the dielectric ceramic layer having high dielectric constant, and is calcined at 1,000° C. for at least one hour.

The calcined material is pulverized and mixed with about 3.0 to 35.0 percent by weight of a glass component which is composed of about 20.0 to 65.0 mole percent of barium oxide, about 5.0 to 50.0 mole percent of silicon oxide and about 10.0 to 50.0 mole percent of boron oxide. The mixture is further mixed with an organic vehicle, dispersant, plasticizer and organic solvent to form an organic slurry. The organic slurry is formed by the doctor blade process into green sheets for the dielectric ceramic layer.

Holes are provided in the green sheets for the insulating ceramic layer and the dielectric ceramic layer, if necessary. These holes are filled with an conductive paste containing, for example, copper or a powdered conductor to form via holes. A predetermined pattern is printed using a conductive paste containing, for example, copper onto each green sheet to form capacitors and a lead line pattern. The green sheets for the insulating ceramic layer and for the dielectric ceramic layers are laminated.

The green sheet laminate is pressed to form a laminate block. The laminate block may be cut into a proper size or may be provided with grooves. The laminate block is sintered at a temperature of not greater than 1,000 ° C. in a reducing atmosphere to form the multilayered ceramic substrate 1 shown in FIG. 1.

In the above embodiment, the dielectric ceramic layer is formed of green sheets. Alternatively, the dielectric ceramic layer may be formed by a printing process, as described below. The powdered materials for the dielectric ceramic layer are mixed with an organic vehicle including an organic solvent and a plasticizer to form a paste, and the paste is printed on required portions of a predetermined green sheet for the insulating ceramic layer to form a thick print as the dielectric ceramic layer (see FIG. 2). In this case, the dielectric ceramic layer is formed and then green sheets are laminated, pressed, cut and sintered to form a multilayered ceramic substrate.

The multilayered ceramic substrate in accordance with the present invention will now be described in further detail.

In the multilayered ceramic substrate in accordance with the present invention, it is preferable that the glass component composed of a mixture of barium oxide, silicon oxide and boron oxide be used. That is, the addition of the $BaO$—$SiO_2$-$B_2O_3$ glass component to a dielectric ceramic component represented by $BaO$—$TiO_2$-$(Nd_{1-m}Me_m)O_{3/2}$ contributes to superior electrical characteristics of the multilayered ceramic substrate without deterioration of superior characteristics of the dielectric ceramic component.

The $BaO$—$SiO_2$-$B_2O_3$ glass component is an inorganic oxide component having substantially the same composition as that of the $BaO$—$Al_2O_3$-$SiO_2$ low temperature sintered ceramic material. Thus, the insulating ceramic substrate formed of the insulating ceramic material is sufficiently bonded to the dielectric ceramic substrate formed of the dielectric ceramic material. As a result, the multilayered ceramic substrate has high mechanical strength.

In the multilayered ceramic substrate and the dielectric ceramic composition in accordance with the present invention, it is preferable that the glass component contain about 20.0 to 55.0 mole percent of barium oxide as $BaO$, about 5.0 to 50.0 mole percent of silicon oxide as $SiO_2$, and about 10.0 to 50.0 mole percent of boron oxide as $B_2O_3$. See FIG. 3. By using such a glass component, the dielectric ceramic layer has superior electric characteristics, i.e., a Q value of at least 1,500, a specific dielectric constant of at least 35 and a temperature coefficient of electrostatic capacitance within a range of ±150 ppm.

The content of the above glass component in a range of about 3.0 to 35.0 percent by weight of the dielectric ceramic material represented by $BaO$—$TiO_2$-$(Nd_{1-m}Me_m)O_{3/2}$ is effective for satisfactory balance between mechanical strength, Q value, specific dielectric constant and temperature coefficient of capacitance. When the content of the glass component is less than about 3.0 percent by weight, the dielectric ceramic composition must be sintered at a higher temperature, although the substrate has high mechanical strength. When the content exceeds about 35.0 percent by weight, the substrate has insufficient mechanical strength, although the sintering temperature can be lowered.

Figure 4:
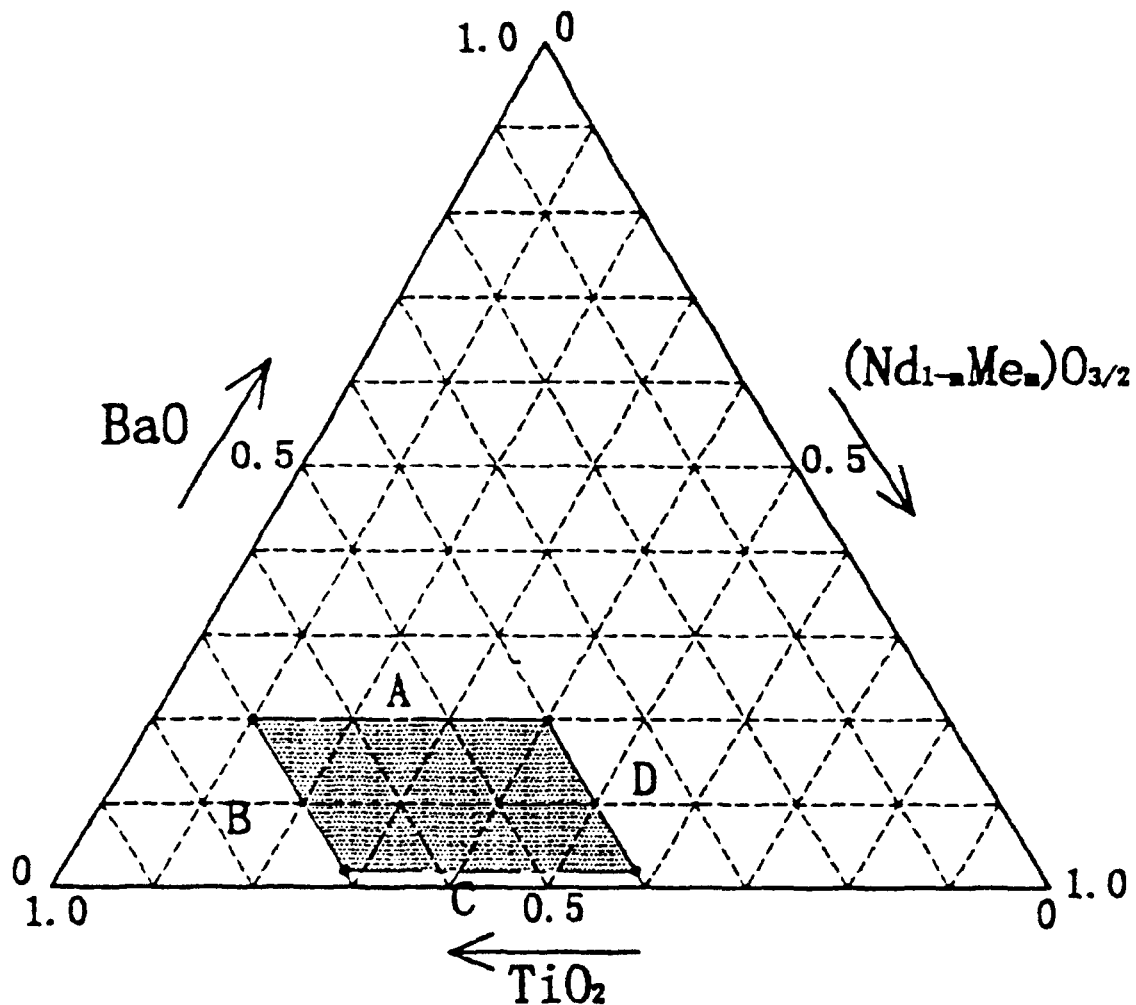
FIG. 4 is a ternary diagram of constituents of a $BaO-TiO_2-(Nd_{1-m}Me_m)O_{3/2}$ dielectric ceramic component in accordance with the present invention.

In a preferred embodiment, when the dielectric ceramic component is represented by $xBaO$—$yTiO_2$-$z(Nd_{1-m}Me_m)O_{3/2}$, $x+y+z=1$, x, y and z have a molar ratio within a region surrounded by the coordinates A ($x=0.20$, $y=0.70$ and $z=0.10$), B ($x=0.20$, $y=0.40$ and $z=0.40$), C ($x=0.02$, $y=0.70$ and $z=0.28$) and D ($x=0.02$, $y=0.40$ and $z=0.58$) in a ternary diagram. FIG. 4 shows the preferable range of the molar ratio between x, y and z. In FIG. 4, a composition in the region A is not satisfactorily sintered and the resulting sintered compact is not dense. A composition in the region B has a large positive temperature coefficient and will cause unstable sintering in some cases. A composition in the region C has a large negative temperature coefficient. The region surrounded by the coordinates A, B, C and D also includes the lines between these coordinates.

It is preferable that lead oxide as PbO be added in an amount of about 17 percent by weight or less of the dielectric ceramic component. As the Pb content increases, the specific dielectric constant increases and the temperature coefficient shifts to the negative side. However, a content exceeding about 17 percent by weight causes unstable sintering.

By using a $BaO$—$Al_2O_3$-$SiO_2$—based low temperature sintering ceramic material, a low-melting-point metal having low specific resistance, such as copper, can be arranged in the multilayered ceramic substrate and can be simultaneously sintered in a reducing atmosphere. The resulting multilayered ceramic substrate has superior high frequency characteristics. The low temperature sintering ceramic material has substantially the same inorganic oxide composition as that of the $BaO$—$SiO_2$-$B_2O_3$ glass component. Thus, the insulating ceramic material layer and the dielectric ceramic material layer have high affinity and high bonding strength, resulting in stable properties of the substrate.

Preferably, the multilayered ceramic substrate in accordance with the present invention is provided with a copper-based conductive pattern. Since the dielectric ceramic composition in accordance with the present invention does not contain an inorganic oxide component such as bismuth oxide, which is readily reduced in a reducing atmosphere, the dielectric ceramic composition can be sintered in a reducing atmosphere. Thus, the dielectric ceramic composition can be simultaneously sintered with an inexpensive copper-based material having significantly low specific resistance, and the resulting multilayered ceramic substrate is highly stable without diffusion. The $BaO$—$Al_2O_3$-$SiO_2$ low temperature sintering ceramic material also can be simultaneously sintered in a reducing atmosphere.

The present invention is not limited to the above-mentioned embodiments. For example, the insulating ceramic layer may be composed of a low temperature sintering ceramic material such as $BaO$—$SrO$—$SiO_2$ or $BaO$—$SiO_2$—$Li_2O$ instead of the above $BaO$—$Al_2O_3$-$SiO_2$. These low temperature sintering ceramic materials also have substantially the same inorganic oxide composition as that of the glass component.

The multilayered ceramic substrate in accordance with the present invention can be used as monolithic electronic components, such as LC filters (inductive filters), and ceramic packages, in addition to as substrates for mounting devices, such as semiconductor ICs and chip capacitors. When resistances are formed on the front and/or rear surfaces of the multilayered ceramic substrate or when choke coils and strip lines are formed in the insulating ceramic layer or the dielectric ceramic layer, the substrate can be further miniaturized.

Any conductive material other than copper-based materials can be used for the electrode pattern, the via hole pattern and the lead line pattern. Examples of preferable materials include low melting point metals such as silver, silver-Palladium, silver-platinum and gold, and high melting point metals, such as tungsten and molybdenum.

EXAMPLES

The present invention will now be described with reference to the following Examples.

A series of $BaO$—$TiO_2$-$(Nd_{1-m}Me_m)O_{3/2}$ mixtures having compositions shown in Table 1 were calcined at a temperature of at least 1,000° C. for at least one hour in air. Each calcined mixture was pulverized and mixed with a $BaO$—$SiO_2B_2O_3$ glass component having a formulation shown in Table 1. The mixture was further mixed with appropriate amounts of binder, dispersant, plasticizer and organic solvent to form an organic slurry for a dielectric ceramic layer.

The mixture was shaped by the doctor blade process to form ceramic green sheets. A predetermined number of ceramic green sheets were laminated, pressed and cut into a proper shape. The cut piece was sintered at a temperature of not greater than 1,000° C. in a reducing atmosphere. Copper electrodes are provided on two faces of the dielectric ceramic sheet to measure the specific dielectric constant Er, the Q value and the temperature coefficient of electrostatic capacitance Tcc. The results are shown in Table 2.

Next, green sheets formed of $BaO$—$Al_2O_3$-$SiO_2$-based low temperature sintering ceramic material and the above green sheets for the dielectric ceramic layer are laminated to form a multilayered ceramic substrate shown in FIG. 1. The bending strength and the sintering temperature of the multilayered ceramic substrate were measured. The results are shown in Table 2. In Table 2, the sintering temperature indicates a temperature when the sintered compact has the highest density.

The results in Table 2 suggest that Sample 8 having a BaO content of less than 20.0 mole percent in the glass component has a relatively small Q value and a relatively large temperature coefficient of electrostatic capacitance Tcc and causes an increase in sintering temperature of the multilayered ceramic substrate. Sample 9, having a BaO content exceeding 65.0 mole percent, has a relatively large temperature coefficient Tcc and causes an increase in sintering temperature, regardless of superior bending strength.

Sample 10, having an $SiO_2$ content of less than 5.0 percent, causes an increase in sintering temperature, whereas Sample 11, having an $SiO_2$ content exceeding 50.0 mole percent, has a small Q value and a large temperature coefficient of electrostatic capacitance, and causes an increase in sintering temperature.

Sample 12, having a $B_2O_3$ content of less than 10.0 mole percent, has a large temperature coefficient of electrostatic capacitance and causes an increase in sintering temperature, whereas Sample 13, having a $B_2O_3$ content exceeding 50.0 mole percent, causes small bending strength of the substrate.

Sample 14 shows that the sintering temperature increases when the content of the glass component is less than 3.0 percent by weight of the dielectric ceramic composition. Sample 16 shows that the bending strength of the substrate decreases when the content of the glass component exceeds 35.0 percent by weight.

Figure 3:
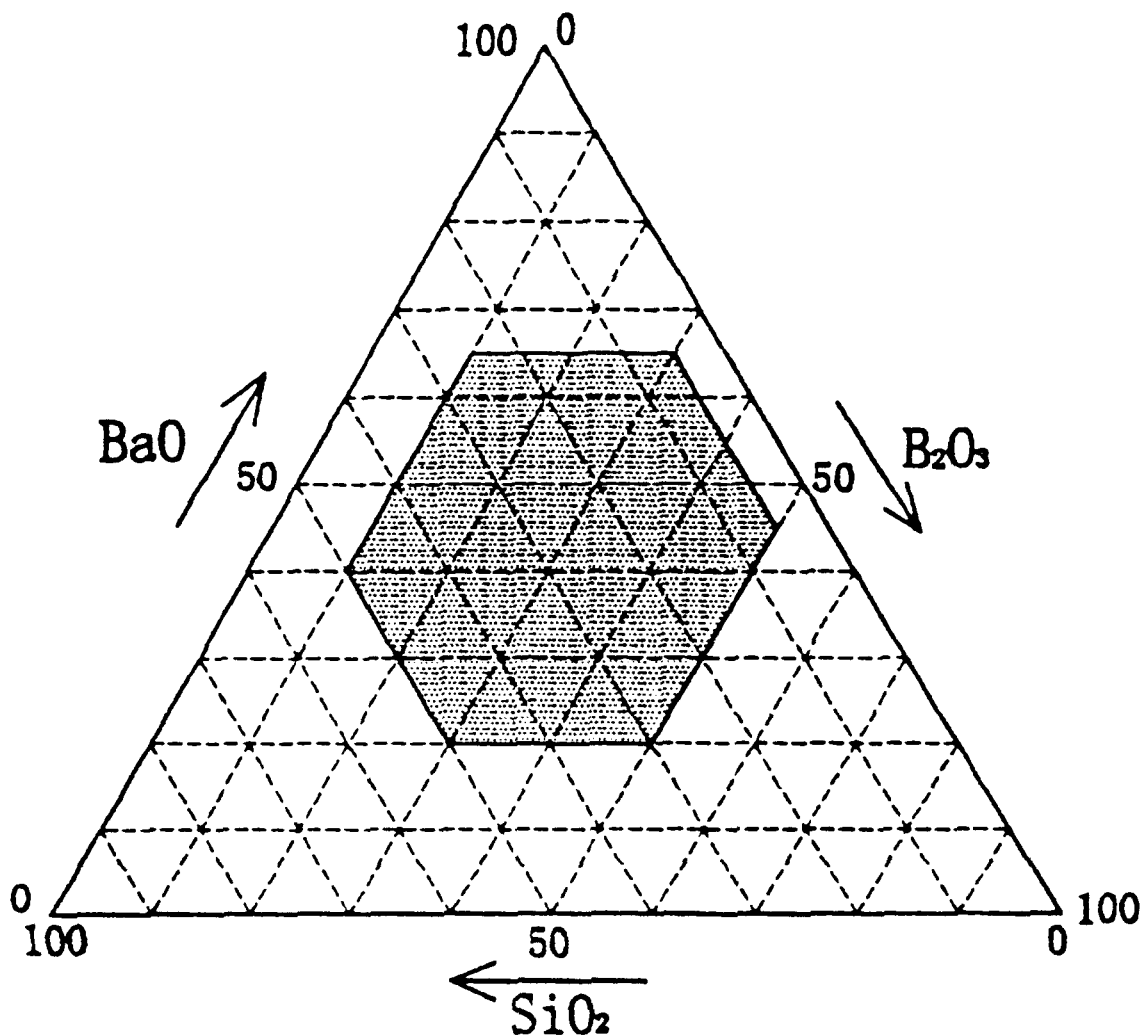
FIG. 3 is a ternary diagram of constituents of a glass component in a dielectric ceramic composition in accordance with the present invention.

In contrast, as shown in Samples 1 to 7, when the $BaO$—$SiO_2$-$B_2O_3$ glass component contain about 20.0 to 65.0 mole percent of BaO, about 5.0 to 50.0 mole percent of $SiO_2$ and about 10.0 to 50.0 mole percent of $B_2O_3$, as shown in the ternary diagram in FIG. 3, the dielectric ceramic sheets show high Q values, high specific dielectric constants, satisfactory temperature coefficients of electrostatic capacitance Tcc, high bending strengths of the substrate and low sintering temperatures.

With reference to Samples 14 to 16, a preferable content of the glass component in the dielectric ceramic material lies in a range of about 3.0 to 35.0 percent by weight in view of the balance between the bending strength of the substrate and the sintering temperature.

When the $BaO$—$SiO_2$-$B_2O_3$ glass component contains about 20.0 to 65.0 mole percent of BaO, about 5.0 to 50.0 mole percent of $SiO_2$, and about 10.0 to 50.0 mole percent of $B_2O_3$, and when the dielectric ceramic material contains about 3.0 to 35.0 percent by weight glass component, the ceramic sheet has further improved characteristics, that is, a Q value of at least 1,500, a specific dielectric constant $\in$r of at least 35, and a temperature coefficient of electrostatic capacitance Tcc in a range of ±150 ppm. Since the sheet has a low sintering temperature, this can be simultaneously sintered together with an $BaO$—$Al_2O_3$-$SiO_2$ insulating ceramic substrate and a low melting point metal and has the resulting substrate has high mechanical strength.

According to the present invention, a ceramic material having a low dielectric constant is used in a portion avoiding generation of stray capacitance and a dielectric ceramic material having a high dielectric constant is used in a portion requiring high capacitance. By such a combination, the resulting multilayered ceramic substrate can mount capacitors having high capacitance and can be miniaturized and thinned. Since the dielectric ceramic material is used only in required portions, stray capacitance between electrodes and lead lines can be suppressed as much as possible. When the dielectric ceramic layer is formed of green sheets, the thickness of the dielectric film between capacitors can be maintained constant. Thus, capacitors having high capacitance can be readily formed with high accuracy without trimming for adjusting the capacitance.

Since both the insulating ceramic layer having a low dielectric constant and the dielectric ceramic layer having a high dielectric constant contain substantially the same inorganic oxide component, these layers can be sufficiently bonded to each other. Thus, the insulating ceramic layer and the dielectric ceramic layer has high bonding strength and the resulting dielectric ceramic substrate has high mechanical strength.

Since the dielectric ceramic composition contains a lanthanoid Me, functioning as a sintering accelerator, a relatively large amount of $SiO_2$ can be added as the glass component. Thus, the resulting substrate has high mechanical strength.

TABLE 1

| | Dielectric Ceramic Component $xBaO$-$yTiO_2$-$z(Nd_{1-m}Me_m)O_{3/2}$ | | | | | PbO | Glass Component (mole %) | | | Content of Glass Component |
|---|---|---|---|---|---|---|---|---|---|---|
| Sample | x | y | z | m | Me | (weight %) | BaO | $SiO_2$ | $B_2O_3$ | (weight %) |
| 1 | 11 | 59 | 30 | 0.05 | Ce | 10.0 | 40.0 | 20.0 | 40.0 | 10.0 |
| 2 | 20 | 70 | 10 | 0.40 | Ce | 0 | 40.0 | 20.0 | 40.0 | 10.0 |
| 3 | 20 | 40 | 40 | 0.10 | Ce | 0 | 40.0 | 20.0 | 40.0 | 10.0 |
| 4 | 5 | 75 | 20 | 0.20 | Ce | 5.0 | 40.0 | 20.0 | 40.0 | 10.0 |
| 5 | 2 | 70 | 28 | 0.15 | Ce | 10.0 | 40.0 | 20.0 | 40.0 | 10.0 |
| 6 | 11 | 59 | 30 | 0.15 | Sm | 10.0 | 40.0 | 20.0 | 40.0 | 10.0 |
| 7 | 11 | 59 | 30 | 0.15 | La | 10.0 | 40.0 | 20.0 | 40.0 | 10.0 |
| 8 | 11 | 59 | 30 | 0.15 | Ce | 10.0 | 10.0 | 45.0 | 45.0 | 10.0 |
| 9 | 11 | 59 | 30 | 0.15 | Ce | 10.0 | 70.0 | 15.0 | 15.0 | 10.0 |
| 10 | 11 | 59 | 30 | 0.15 | Ce | 10.0 | 55.0 | 2.0 | 43.0 | 10.0 |
| 11 | 11 | 59 | 30 | 0.15 | Ce | 10.0 | 20.0 | 60.0 | 20.0 | 10.0 |
| 12 | 11 | 59 | 30 | 0.15 | Ce | 10.0 | 50.0 | 45.0 | 5.0 | 10.0 |
| 13 | 11 | 59 | 30 | 0.15 | Ce | 10.0 | 10.0 | 10.0 | 80.0 | 10.0 |
| 14 | 11 | 59 | 30 | 0.15 | Ce | 10.0 | 40.0 | 20.0 | 40.0 | 2.0 |

TABLE 1-continued

| | Dielectric Ceramic Component xBaO-yTiO$_2$-z(Nd$_{1-m}$Me$_m$)O$_{3/2}$ | | | | | PbO | Glass Component (mole %) | | | Content of Glass Component |
|---|---|---|---|---|---|---|---|---|---|---|
| Sample | x | y | z | m | Me | (weight %) | BaO | SiO$_2$ | B$_2$O$_3$ | (weight %) |
| 15 | 11 | 59 | 30 | 0.15 | Ce | 10.0 | 40.0 | 20.0 | 40.0 | 20.0 |
| 16 | 11 | 59 | 30 | 0.15 | Ce | 10.0 | 40.0 | 20.0 | 40.0 | 40.0 |

TABLE 2

| Sample | εr | Q Value | Tcc (ppm) | Bending Strength of Substrate (Kg/cm$^2$) | Sintering Temperature (° C.) |
|---|---|---|---|---|---|
| 1 | 60 | 2590 | −5 | 2530 | 980 |
| 2 | 57 | 4970 | +120 | 2640 | 975 |
| 3 | 39 | 2170 | −8 | 2720 | 990 |
| 4 | 56 | 3290 | +185 | 2540 | 985 |
| 5 | 44 | 2240 | +33 | 2560 | 980 |
| 6 | 59 | 2030 | −25 | 2680 | 983 |
| 7 | 65 | 2150 | −11 | 2750 | 977 |
| 8 | 54 | 1100 | −205 | 3020 | 1120 |
| 9 | 43 | 2610 | −183 | 2400 | 1010 |
| 10 | 49 | 2130 | −50 | 2210 | 1170 |
| 11 | 58 | 860 | −535 | 3120 | 1205 |
| 12 | 55 | 2770 | −480 | 3505 | 1224 |
| 13 | 49 | 1715 | +75 | 1805 | 810 |
| 14 | 73 | 3100 | −15 | 3650 | 1340 |
| 15 | 38 | 1800 | −3 | 2030 | 940 |
| 16 | 29 | 820 | +12 | 1420 | 770 |

While the invention has been described in detail and with reference to specific examples thereof, it will be apparent to one skilled in the art that various changes and modifications can be made therein without departing from the spirit and scope thereof.

What is claimed is:

1. A multilayered ceramic substrate comprising an insulating ceramic layer having a low dielectric constant and a dielectric ceramic layer having a high dielectric constant,
   wherein the insulating ceramic layer comprises a low temperature sintering ceramic which comprises barium oxide, aluminum oxide and silicon oxide, and
   wherein the dielectric ceramic layer comprises a sintered mixture of a dielectric ceramic component represented by BaO—TiO$_2$-(Nd$_{1-m}$Me$_m$)O$_{3/2}$ and a glass component comprising barium oxide, silicon oxide and boron oxide, wherein Me is a lanthanoid and 0≦m≦1.0.

2. A multilayered ceramic substrate according to claim 1, further comprising a copper conductive pattern.

3. A multilayered ceramic substrate according to claim 2, wherein the multilayered ceramic substrate comprises a sintered laminate of insulating ceramic layer green sheet and dielectric ceramic layer green sheet.

4. A multilayered ceramic substrate according to claim 1, wherein the multilayered ceramic substrate comprises a sintered laminate of insulating ceramic layer green sheets and dielectric ceramic layer thick film.

5. A multilayered ceramic substrate according to claim 1, wherein the glass component comprises about 20.0 to 65.0 mole percent of barium oxide, about 5.0 to 50.0 mole percent of silicon oxide and about 10.0 to 50.0 mole percent of boron oxide.

6. A multilayered ceramic substrate according to claim 5, wherein the content of the glass component is about 3.0 to 35.0 percent by weight of the dielectric ceramic component.

7. A multilayered ceramic substrate according to claim 6, wherein when the dielectric ceramic component is represented by $$xBaO\text{—}yTiO_2\text{-}z(Nd_{1-m}Me_m)O_{3/2},$$

wherein x+y+z=1, and x, y and z have a molar ratio within a region surrounded by the coordinates A (x=0.20, y=0.70 and z=0.10), B (x=0.20, y=0.40 and z=0.40), C (x=0.02, y=0.70 and z=0.28) and D (x=0.02, y=0.40 and z=0.58) in a ternary diagram thereof.

8. A multilayered ceramic substrate according to claim 7, further comprising lead oxide in an amount of which does not exceed about 17 percent by weight of the dielectric ceramic component.

9. A multilayered ceramic substrate according to claim 8, wherein m is 0.05 to 0.4, Me is Ce, Sm or La and wherein the amount of lead oxide is 5 to 10%.

10. A multilayered ceramic substrate according to claim 9, further comprising a copper conductive pattern.

11. A multilayered ceramic substrate according to claim 10, wherein the multilayered ceramic substrate comprises a sintered laminate of insulating ceramic layer green sheet and dielectric ceramic layer green sheet.

12. A multilayered ceramic substrate according to claim 1, wherein the content of the glass component is about 3.0 to 35.0 percent by weight of the dielectric ceramic component.

13. A multilayered ceramic substrate according to claim 12, further comprising a copper conductive pattern.

14. A multilayered ceramic substrate according to claim 13, wherein the multilayered ceramic substrate comprises a sintered laminate of insulating ceramic layer green sheet and dielectric ceramic layer green sheet.

15. A multilayered ceramic substrate according to claim 1, wherein when the dielectric ceramic component is represented by $$xBaO\text{—}yTiO_2\text{-}z(Nd_{1-m}Me_m)O_{3/2},$$

wherein x+y+z=1, and x, y and z have a molar ratio within a region surrounded by the coordinates A (x=0.20, y=0.70 and z=0.10), B (x=0.20, y=0.40 and z=0.40), C (x=0.02, y=0.70 and z=0.28) and D (x=0.02, y=0.40 and z=0.58) in ternary diagram thereof.

16. A multilayered ceramic substrate according to claim 15 further comprising a copper conductive pattern.

17. A multilayered ceramic substrate according to claim 16 wherein the multilayered ceramic substrate comprises a sintered laminate of insulating ceramic layer green sheet and dielectric ceramic layer green sheet.

18. A multilayered ceramic substrate according to claim 1, further comprising lead oxide in an amount of which does not exceed about 17 percent by weight of the dielectric ceramic component.

19. A multilayered ceramic substrate according to claim 18, further comprising a copper conductive pattern.

20. A multilayered ceramic substrate according to claim 19, wherein the multilayered ceramic substrate comprises a sintered laminate of insulating ceramic layer green sheet and dielectric ceramic layer green sheet.

* * * * *